United States Patent [19]
Trimberger

[11] Patent Number: 5,831,907
[45] Date of Patent: Nov. 3, 1998

[54] REPAIRABLE MEMORY CELL FOR A MEMORY CELL ARRAY

[75] Inventor: Stephen M. Trimberger, San Jose, Calif.

[73] Assignee: Xilinx, Inc., San Jose, Calif.

[21] Appl. No.: 858,717

[22] Filed: May 19, 1997

[51] Int. Cl.$^6$ .................................................. G11C 16/04
[52] U.S. Cl. ...................... 365/189.04; 365/154; 365/156
[58] Field of Search ............................... 365/189.04, 156, 365/154

[56] References Cited

U.S. PATENT DOCUMENTS 5,631,863   5/1997   Fechner et al. ........................... 365/156

OTHER PUBLICATIONS

Hanchek et al., "Node–Covering Based Defect and Fault Tolerance Methods for Increased Yield in FPGAs," Ninth International Conference on VLSI Design, Jan., 1996.

*Primary Examiner*—David C. Nelms
*Assistant Examiner*—Hoai Ho
*Attorney, Agent, or Firm*—E. Eric Hoffman; Jeanette S. Harms

[57] ABSTRACT

A memory cell array includes a first memory cell, a second memory cell, and a bit line which extends between the first and second memory cells. During normal operation, the bit line is used as a write path for data values to be written to the first and second memory cells. If the first memory cell is defective, the bit line is used to route the data value stored in the second memory cell to the first memory cell, effectively replacing the first memory cell with the second memory cell. In another embodiment, a memory cell array includes a first memory cell for storing a first data value and a second memory cell for storing a second data value. A first pair of bit lines are coupled to the first memory cell, and the first data value is written to the first memory cell on the first pair of bit lines. A second pair of bit lines are coupled to the second memory cell, and the second data value is written to the second memory cell on the second pair of bit lines. A multiplexer is coupled to receive the first data value and the second data value. The multiplexer routes a selected one of the first and second data values to an output terminal associated with the first memory cell in response to signals provided on the first pair of bit lines.

10 Claims, 5 Drawing Sheets

REPAIRABLE MEMORY CELL FOR A MEMORY CELL ARRAY

BACKGROUND OF THE INVENTION

1. Field of the Invention

The present invention relates to a memory cell architecture which includes a redundancy mechanism for repairing defective memory cells.

2. Description of Related Art

Figure 1:
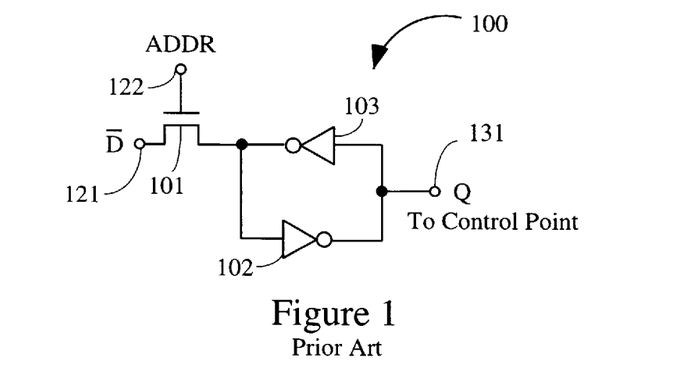
FIG. 1 is a schematic diagram of a conventional five transistor configuration memory cell.

FIG. 1 is a schematic diagram of a conventional five transistor memory cell 100. Memory cell 100 includes n-channel access transistor 101, and inverters 102 and 103. Inverters 102 and 103 are cross-coupled to form a latch. Inverter 102 provides an output signal Q to output terminal 131. Memory cell 100 can be latched in either a logic low state (Q=logic low) or a logic high state (Q=logic high). The drain of access transistor 101 is coupled to receive an input signal $\overline{D}$ on input terminal 121. The gate of access transistor 101 is coupled to receive a control signal ADDR on input terminal 122. The source of access transistor 101 is coupled to the input terminal of inverter 102 and the output terminal of inverter 103.

Memory cell 100 is programmed by asserting a logic high control signal ADDR on input terminal 122, while controlling the input signal $\overline{D}$ applied to input terminal 121 to have either a logic high voltage level (e.g., $V_{cc}$ or 5 volts), or a logic low voltage level (e.g., $V_{ss}$ or 0 volts.) with sufficient strength to overcome inverter 103. When the input signal $\overline{D}$ has a logic low voltage level, memory cell 100 is programmed in a logic high state. Conversely, when the input signal $\overline{D}$ has a logic high level, memory cell 100 is programmed in a logic low state.

Memory cell 100 is commonly used as a configuration memory cell which stores a configuration bit in a field programmable gate array (FPGA). In general, output terminal 131 of memory cell 100 is connected to a control point of the FPGA (not shown). This control point can be, for example, the gate electrode of a pass transistor. The state of memory cell 100 determines whether the pass transistor is turned on, thereby completing a programmable connection between two different elements of the FPGA, or turned off, thereby isolating two different elements of the FPGA. If memory cell 100 is defective, the configuration of the FPGA can also be defective.

Figure 2:
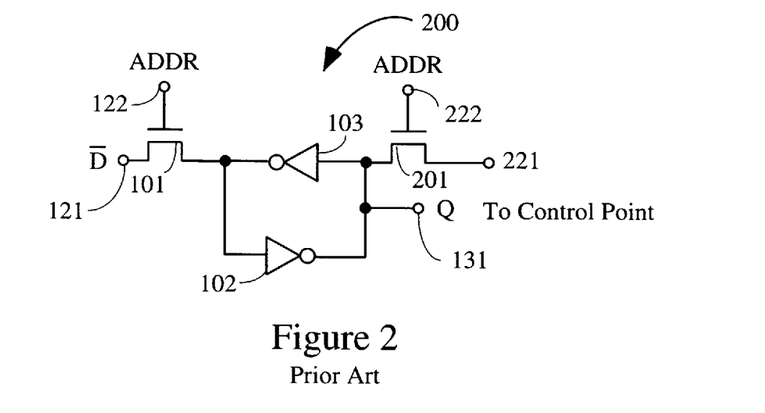
FIG. 2 is a schematic diagram of a conventional six transistor configuration memory cell.

FIG. 2 is a schematic diagram of a conventional six transistor memory cell 200. Memory cell 200 is similar to memory cell 100. Thus, similar elements in memory cells 100 and 200 are labeled with similar reference numbers. In addition to the previously described elements of memory cell 100, memory cell 200 includes a second access transistor 201, which is coupled between output terminal 131 and input terminal 221.

In memory cell 200, the gate electrode of second access transistor 201 is coupled to receive the control signal ADDR. When the state of memory cell 200 is to be programmed, the control signal ADDR is asserted to turn on both of the access transistors 101 and 201. A logic low voltage is then applied to the drain of one of the transistors 101 and 201, and a logic high voltage is applied to the drain of the other of transistors 101 and 201. Like memory cell 100, memory cell 200 can be used as a configuration memory cell in an FPGA. Defects in either of memory cells 100 or 200 can result in a defective FPGA. Known methods for repairing defective memory cells typically require extensive redundant routing resources, thereby undesirably expanding the layout area and increasing routing congestion within the FPGA. One such redundancy scheme is described in "Node-Covering Based Defect and Fault Tolerance Methods for Increased Yield in FPGAs" by Hanchek and Dutt, Proceedings of the Ninth International Conference on VLSI Design, January 1996.

It would therefore be desirable to have a redundancy mechanism for replacing defective configuration memory cells within an FPGA, without significantly increasing the routing congestion or required layout area of the FPGA.

SUMMARY OF THE INVENTION

Accordingly, the present invention provides a memory cell array which includes a first memory cell, a second memory cell, and a bit line which extends between the first and second memory cells. During normal operation, the bit line is used to route data values to be written to the first and second memory cells. If the first memory cell turns out to be a defective memory cell, the bit line is used to route the data value stored in the second memory cell to the output of the first memory cell, thereby effectively replacing the first memory cell with the second memory cell.

A control transistor can be provided within the first memory cell for disabling the defective first memory cell. The first memory cell can further include a first access transistor for coupling the first memory cell to the bit line, and the second memory cell can include a second access transistor for coupling the second memory cell to the bit line. The first and second access transistors are both turned on to route the data value stored in the second memory cell to the defective first memory cell.

The present invention also includes a method of operating an array of memory cells which includes the steps of: (1) testing the memory cells to determine the presence of a defective memory cell, (2) writing a data value intended to be stored in the defective memory cell into a second memory cell which shares a common bit line with the defective memory cell, (3) disabling the memory storage circuit of the defective memory cell, and then (4) routing the data value stored in the second memory cell to the defective memory cell via the common bit line.

A common bit line is therefore used to serve the dual purposes of (1) providing a path for writing data values to a plurality of memory cells, and (2) providing a routing resource for replacing a defective memory cell. By implementing these two functions with a common bit line, the required layout area and routing congestion within the memory cell array are advantageously minimized.

The present invention further includes a memory cell array which includes a first memory cell for storing a first data value and a second memory cell for storing a second data value. A first pair of bit lines is coupled to the first memory cell, and the first data value is written to the first memory cell on the first pair of bit lines. A second pair of bit lines is coupled to the second memory cell, and the second data value is written to the second memory cell on the second pair of bit lines. A multiplexer circuit is coupled to receive the first data value and the second data value. The multiplexer circuit routes a selected one of the first data value and the second data value to an output terminal associated with the first memory cell in response to signals provided on the first pair of bit lines.

The present invention also includes a method of operating an array of memory cells which includes the steps of: (1) testing the memory cells to determine the presence of a defective memory cell, (2) writing a data value intended to be stored in the defective memory cell into a second memory cell which is located adjacent to the defective memory cell, and then (3) routing the data value from the second memory cell to a control point associated with the defective memory cell through a multiplexer, wherein the multiplexer is controlled by signals provided on a pair of bit lines which are coupled to the defective memory cell.

The bit lines of a memory cell are therefore used for the dual purposes of (1) providing a write path for writing data values to the memory cell, and (2) controlling a routing scheme which enables the memory cell to be replaced when defective. As a result, the required layout area and routing congestion within the resulting memory cell array are advantageously minimized.

The present invention will be more fully understood in view of the following detailed description taken together with the drawings.

DETAILED DESCRIPTION OF THE DRAWINGS

Figure 3:
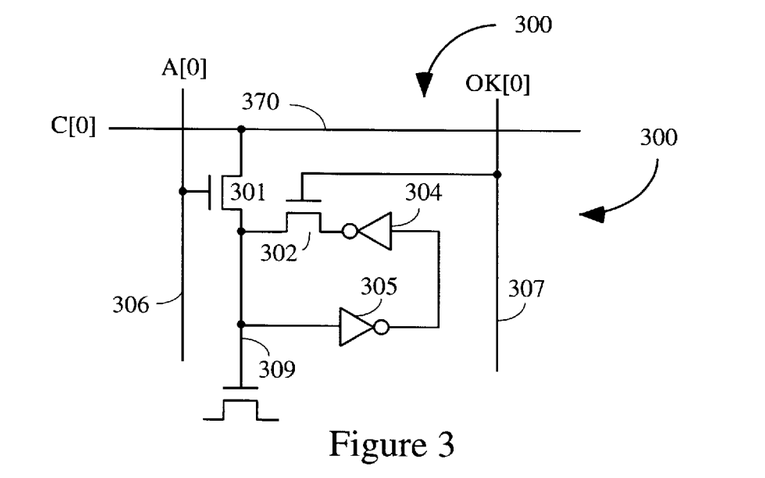
FIG. 3 is a schematic diagram of a six transistor configuration memory cell in accordance with one embodiment of the present invention.

FIG. 3 is a schematic diagram of a six transistor configuration memory cell 300 in accordance with one embodiment of the present invention. Configuration memory cell 300 includes n-channel field effect access transistor 301, n-channel field effect transistor 302, inverters 304 and 305, address line 306, enable/disable control line 307, and bit line 370.

Configuration memory cell 300 is connected as follows. Address line 306 is coupled to the gate of access transistor 301, and bit line 370 is coupled to the drain of access transistor 301. The source of access transistor 301 is coupled to the drain of transistor 302, the input terminal of inverter 305 and output signal line 309. The gate of transistor 302 is coupled to enable/disable control line 307, and the source of transistor 302 is coupled to the output terminal of inverter 304. The input terminal of inverter 304 is coupled to the output terminal of inverter 305.

If configuration memory cell 300 is determined to be a functional memory cell (as described in more detail below) a logic high enable/disable signal OK[0] is asserted on enable/disable control line 307. As a result, transistor 302 is turned on, thereby providing an electrically conductive path between the input terminal of inverter 305 to the output terminal of inverter 304. Inverters 304 and 305 are thereby coupled to form a latch circuit capable of storing a configuration data value.

To program a configuration data value in configuration memory cell 300, transistor 302 is turned off and a logic high address signal A[0] is asserted on address line 306 to turn on access transistor 301. At substantially the same time, a configuration data value C[0] is applied to bit line 370. Then, transistor 302 is turned on to complete the connection of cross-coupled inverters 304 and 305. Consequently, the configuration data value C[0] is stored in the latch circuit formed by inverters 304 and 305. The address signal A[0] is subsequently de-asserted low, thereby isolating inverters 304 and 305 from bit line 370. The configuration data value C[0] stored in the latch circuit formed by inverters 304 and 305 is provided on output line 309. Output line 309 is provided to a control point of the FPGA. The control point can control the configuration of the FPGA. For example, output line 309 can be coupled to a pass transistor 381 which is either turned on to connect a pair of wiring segments, or turned off to isolate the pair of wiring segments. Alternatively, the control point can provide an input signal to a configurable logic block (CLB) of the FPGA. The value of the configuration data value C[0] is selected in view of the intended signal to be provided to the CLB.

Configuration memory cell 300 is tested by attempting to write a configuration data value having a known logic value into configuration memory cell 300. This configuration data value is subsequently read out of configuration memory cell 300 on output signal line 309. The logic value of the configuration data value read out of configuration memory cell 300 is compared with the known logic value to determine whether configuration memory cell 300 is functional or defective. The above steps can be repeated with a configuration data value having a second known logic value which is opposite the initial known logic value. Alternatively, the data value can be read out of the memory cell by turning on transistor 301 and observing the value on bit line 370.

Figure 4:
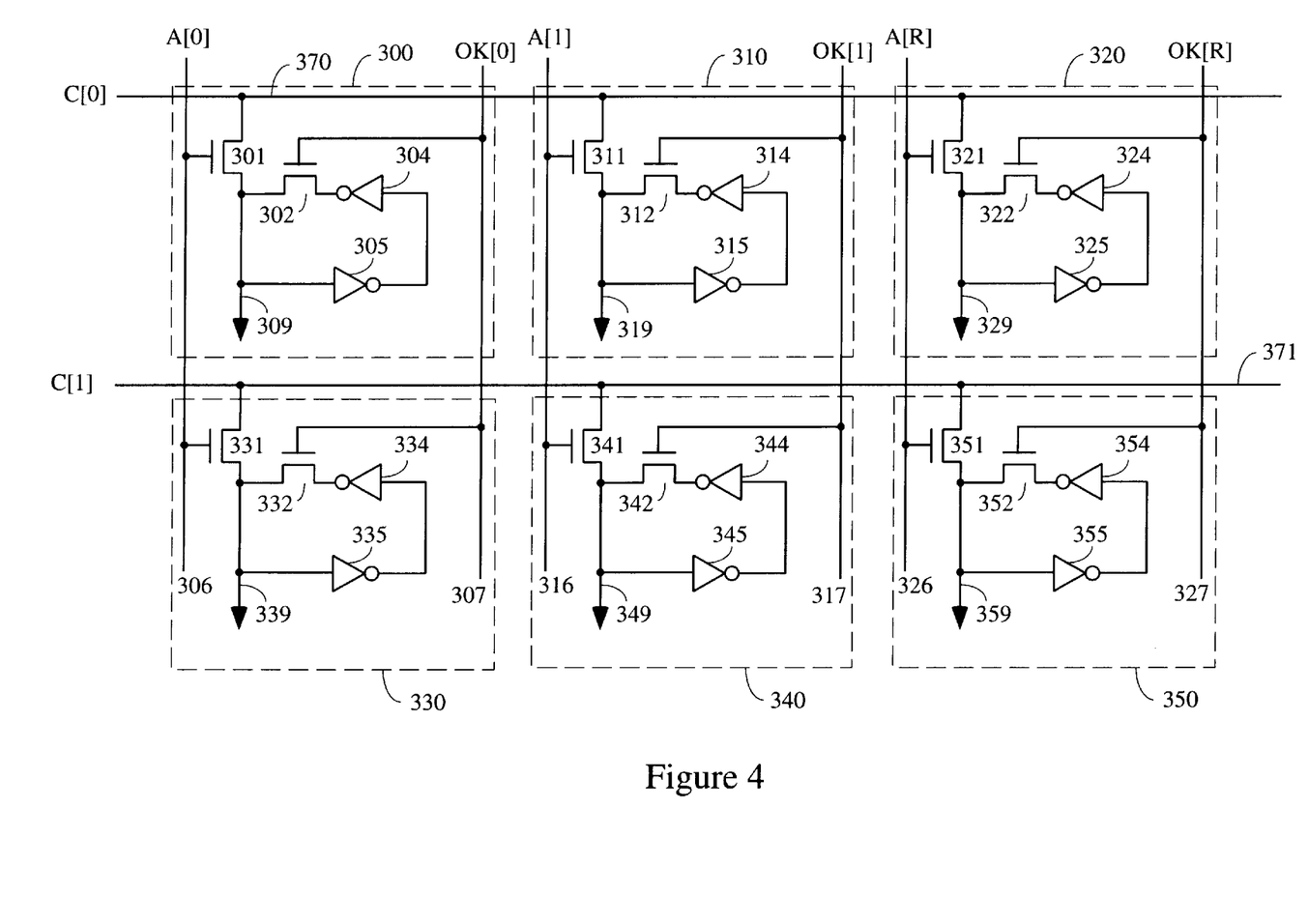
FIG. 4 is a schematic diagram of an array of the six transistor configuration memory cells of FIG. 3.

FIG. 4 is a schematic diagram of a 2×3 array of configuration memory cells 300, 310, 320, 330, 340, and 350 in accordance with one embodiment of the invention. Configuration memory cells 310, 320, 330, 340 and 350 are identical to previously described configuration memory cell 300 (FIG. 3). Although a 2×3 array is illustrated, arrays having other sizes are contemplated and considered within the scope of the invention. Such arrays are typically larger than a 2×3 array. A 2×3 array is used mainly to simplify the following description.

The 2×3 array includes two rows and three columns of configuration memory cells. The first row includes configuration memory cells 300, 310 and 320. Configuration memory cells 300, 310 and 320 include access transistors 301, 311, and 321, respectively, which are commonly connected to bit line 370. Configuration memory cells 310 and 320 further include n-channel transistors 312 and 322, inverters 314–315 and 324–325, and output terminals 319 and 329, respectively, as illustrated. The second row includes configuration memory cells 330, 340 and 350. Configuration memory cells 330, 340 and 350 include access transistors 331, 341, and 351, respectively, which are commonly connected to bit line 371. Configuration memory cells 330, 340 and 350 further include enabling transistors 332, 342, and 352, inverters 334–335, 344–345 and 354–355, and output terminals 339, 349, and 359, respectively, as illustrated.

The first column of the 2×3 array includes configuration memory cells 300 and 330. The gates of access transistors 301 and 331 are commonly connected to address line 306 to receive address signal A[0]. The gate electrodes of transistors 302 and 332 are commonly connected to enable/disable control line 307 to receive enable/disable signal OK[0].

The second column of the 2×3 array includes configuration memory cells 310 and 340. The gate electrodes of access transistors 311 and 341 are commonly connected to address line 316 to receive address signal A[1]. The gate electrodes of transistors 312 and 342 are commonly connected to enable/disable control line 317 to receive enable/disable signal OK[1].

The third column of the 2×3 array is designated as a replacement column. This replacement column includes replacement configuration memory cells 320 and 350. As described in more detail below, replacement configuration memory cells 320 are used to replace a defective column of configuration memory cells. A defective column is defined as a column which includes one or more defective configuration memory cells. The gates of access transistors 321 and 351 are commonly connected to address line 326 to receive address signal A[R]. The gate electrodes of transistors 322 and 352 are commonly connected to enable/disable control line 327 to receive enable/disable signal OK[R].

The replacement of a defective column will now be described in connection with a specific example. In this example, a test of the 2×3 array reveals that configuration memory cell 300 is defective. In this example, it is desired to program configuration memory cells 300 and 340 such that they provide logic high configuration data values on output terminals 309 and 349. Moreover, it is desired to program configuration memory cells 310 and 330 such that these latches provide logic low configuration data values on output terminals 319 and 339.

Because configuration memory cell 300 is defective, the column which contains configuration memory cell 300 (i.e., the first column) is a defective column. The configuration memory cells 300, 330 in this defective column must be replaced with the configuration memory cells 320, 350 of the replacement configuration memory cell column.

To accomplish this, configuration memory cells 320 and 350 of the replacement column are programmed to store the logic values which were intended to be stored in configuration memory cells 300 and 330 of the defective column. To accomplish this, a logic high address signal A[R] is asserted on address line 326 while a logic high configuration data value C[0] is asserted on bit line 370 and a logic low configuration data value C[1] is asserted on bit line 371. As a result, configuration memory cell 320 is programmed to provide a logic high configuration data value on output terminal 329, and configuration memory cell 350 is programmed to provide a logic low configuration data value on output terminal 359.

Similarly, the non-defective column is programmed with the desired logic values. To accomplish this, a logic high address signal A[1] is asserted on address line 316 while a logic low configuration data value C[0] is asserted on bit line 370 and a logic high configuration data value C[1] is asserted on bit line 371. As a result, configuration memory cell 310 is programmed to provide a logic low configuration data value on output terminal 319, and configuration memory cell 340 is programmed to provide a logic low configuration data value on output terminal 349.

Thus, after configuration, memory cells 310, 340, 320 and 350 are programmed. Then, the enable/disable signal OK[0] associated with the defective column is de-asserted low, thereby effectively disabling configuration memory cells 300 and 330 in the defective column by turning off transistors 302 and 332. The enable/disable signals OK[1] and OK[R] associated with the non-defective column (i.e., the second column) and the replacement column are asserted high, thereby enabling the functional configuration memory cells 310, 340, 320, 350 by turning on transistors 312, 342, 322, and 352. The address signal A[0] associated with the defective column and the address signal A[R] associated with the replacement column are both asserted high, thereby turning on the access transistors 301 and 331 in the defective column, and turning on access transistors 321 and 351 in the replacement column. As a result, the configuration data value stored in configuration memory cell 320 is routed through access transistor 321 to bit line 370, and through access transistor 301 to output terminal 309. Thus, the configuration data value stored in replacement configuration memory cell 320 is provided on output terminal 309 of defective configuration memory cell 300.

Similarly, the configuration data value stored in configuration memory cell 350 is routed through access transistor 351 to bit line 371, and through access transistor 331 to output terminal 339. Thus, the configuration data value stored in replacement configuration memory cell 350 is provided on output terminal 339 of configuration memory cell 330.

In the foregoing manner, bit lines 370 and 371 and address lines 306, 316 and 326 advantageously serve dual purposes. First, these bit lines and address lines are used during programming of the configuration memory cells 300, 310, 320, 330, 340, and 350. Second, after the configuration memory cells have been programmed, these bit lines and address lines facilitate the routing which enables a defective column to be replaced with the replacement column. Using the bit lines and address lines to serve these dual purposes advantageously reduces the required amount of routing resources between the configuration memory cells 300, 310, 320, 330, 340, and 350.

Alternatively, replacement configuration memory cells 320 and 350 could be used to replace configuration memory cells 310 and 340 in the case where one or both of configuration memory cells 310 and 340 are defective. Stated more generally, the configuration memory cells of the replacement column can be programmed to replace any one of the other columns in the array.

Figure 5:
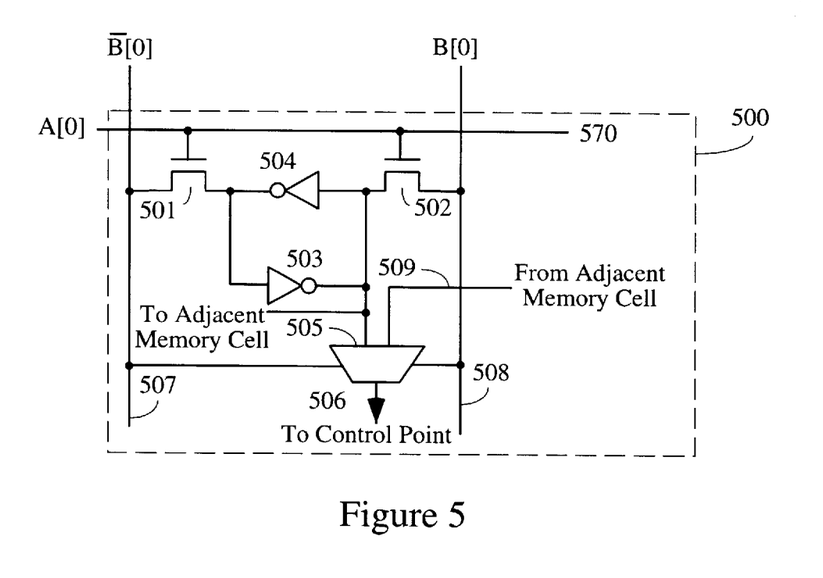
FIG. 5 is a schematic diagram of an eight transistor configuration memory cell in accordance with another embodiment of the invention.

FIG. 5 is a schematic diagram of an eight transistor configuration memory cell 500 in accordance with another embodiment of the invention. Configuration memory cell 500 includes n-channel field effect access transistors 501 and 502, inverters 503 and 504, multiplexer 505, output signal line 506, bit lines 507–508, adjacent cell access line 509, and address line 570.

Address line 570 is coupled to the gates of access transistors 501 and 502. Bit lines 507 and 508 are coupled to the drains of access transistors 501 and 502, respectively, and to the control terminals of multiplexer 505. The input terminal of inverter 503 is coupled to the output terminal of inverter 504 and to the source of access transistor 501. The output terminal of inverter 503 is coupled to the input terminal of inverter 504, the source of transistor 502, and the first input terminal of multiplexer 505. The second input terminal of multiplexer 505 is coupled to adjacent cell access line 509. In general, adjacent cell access line 509 is coupled to receive a configuration data value from an adjacent configuration memory cell. Adjacent cell access line 509 is described in more detail below in connection with FIG. 7.

Address line 570 is further coupled to receive an address access signal A[0], which in turn is provided to the gates of access transistors 501 and 502. When the address access signal A[0] is asserted in a logic high state, access transistors 501 and 502 are turned on, thereby coupling bit lines 507 and 508 to cross coupled inverters 503 and 504. To program a logic high value in configuration memory cell 500, a logic high configuration data value B[0] is asserted on bit line 508 and a logic low configuration data value $\overline{B}$[0] is asserted on bit line 507. When a logic high value is programmed in configuration memory cell 500, a logic high value is provided from the latch formed by inverters 503 and 504 to the first input terminal of multiplexer 505.

Conversely, to program a logic low value in configuration memory cell 500, a logic low configuration data value B[0] is asserted on bit line 508 and a logic high configuration data value $\overline{B}$[0] is asserted on bit line 507. When a logic low value is programmed in configuration memory cell 500, a logic low value is provided from the latch formed by inverters 503 and 504 to the first input terminal of multiplexer 505.

Figure 6A:
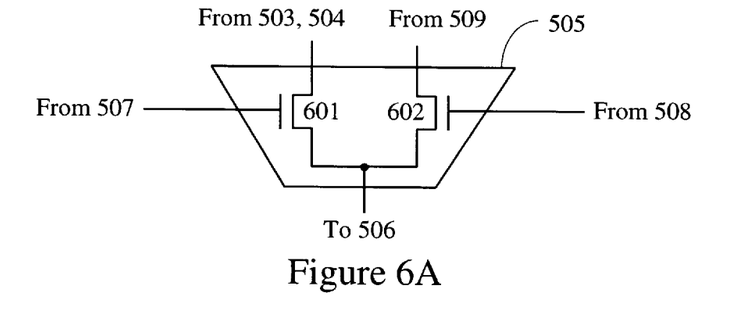
FIGS. 6A and 6B are schematic diagrams of the multiplexer circuit of the configuration memory cell of FIG. 5.
Figure 6B:
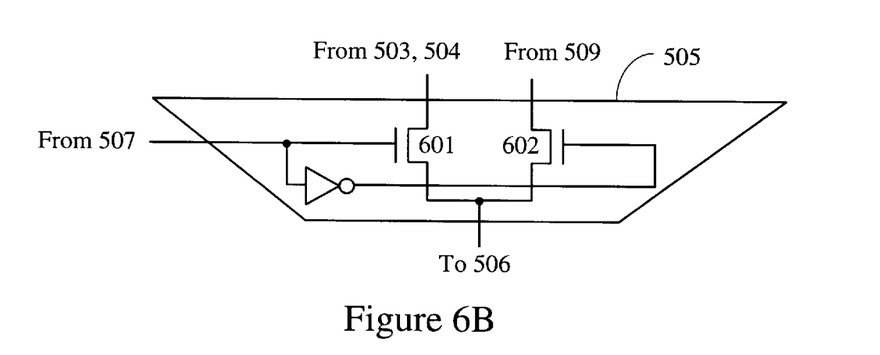

Multiplexer 505 routes a configuration data value from either its first input terminal or its second input terminal to a corresponding control point on output line 506. FIGS. 6A and 6B are schematic diagrams of multiplexer 505 in accordance with two embodiments of the invention. Multiplexer 505 includes two n-channel field effect transistors 601 and 602 as illustrated.

In the embodiment shown in FIG. 6A, the gates of transistors 601 and 602 are coupled to bit lines 507 and 508, respectively. The drain of transistor 601 is coupled to the latch formed by inverters 503 and 504. The drain of transistor 602 is coupled to adjacent cell access line 509. The sources of transistors 601 and 602 are commonly connected to output line 506.

After a configuration data value has been programmed in configuration memory cell 500, multiplexer 505 is controlled to operate as follows. To route the configuration data value stored in configuration memory cell 500 to output line 506, a logic high signal $\overline{B}$[0] is asserted on bit line 507, thereby turning on transistor 601, and a logic low signal B[0] is asserted on bit line 508, thereby turning off transistor 602. To route the configuration data value on adjacent cell access line 509 to output line 506, a logic low signal $\overline{B}$[0] is asserted on bit line 507, thereby turning off transistor 601, and a logic high signal B[0] is asserted on bit line 508, thereby turning on transistor 602. The same operation may be achieved in the embodiment shown in FIG. 6B in which the gates of transistors 601 and 602 are coupled only to bit line 507. In this embodiment, only one bit line is needed to route the configuration value to output line 506.

Figure 7:
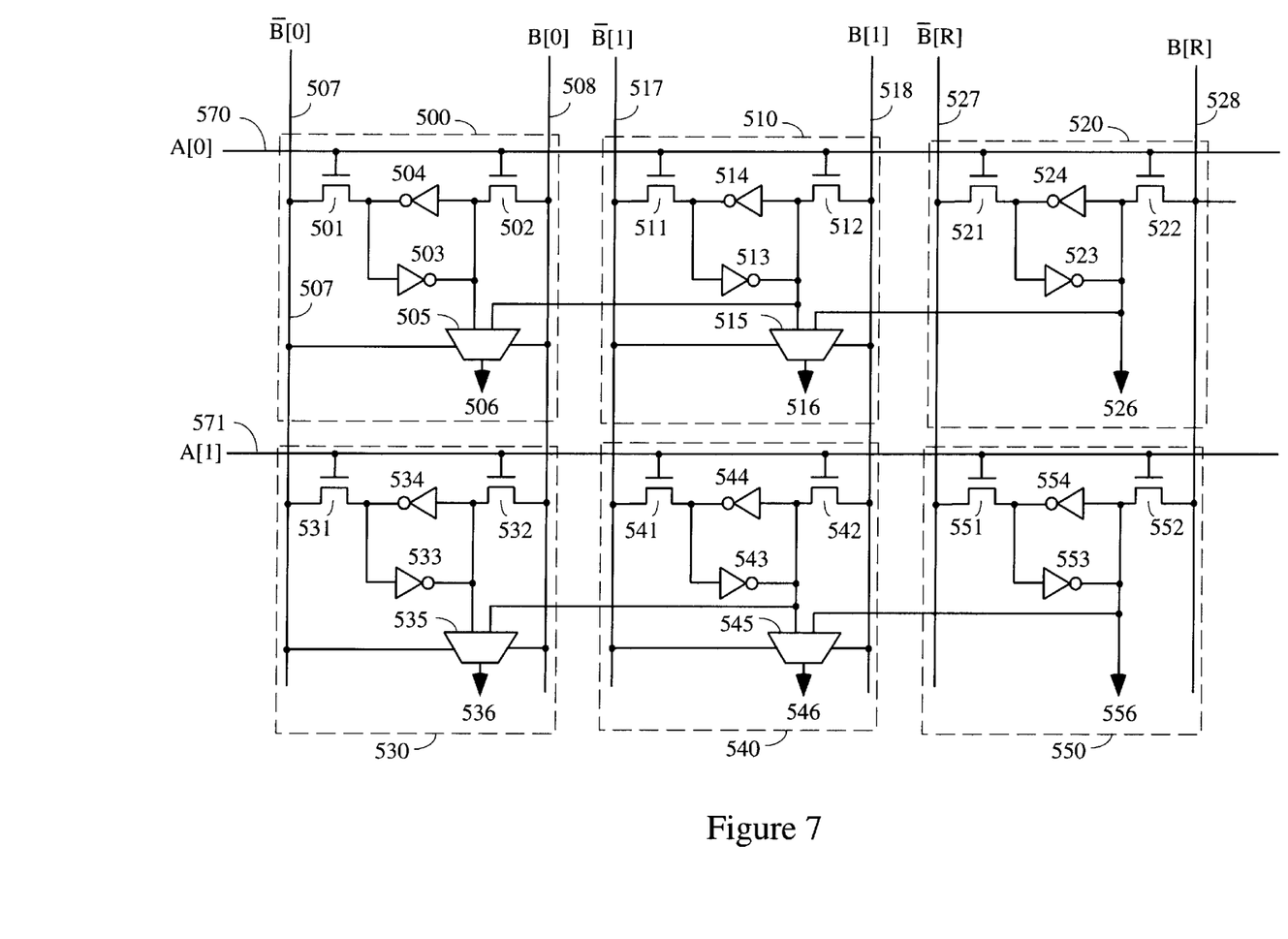
FIG. 7 is a schematic diagram of an array of the eight transistor configuration memory cells of FIG. 5.

FIG. 7 is a schematic diagram of a 2×3 array of configuration memory cells 500, 510, 520, 530, 540 and 550 in accordance with one embodiment of the invention. Configuration memory cells 510, 530, and 540 are identical to previously described configuration memory cell 500 (FIG. 5). Replacement configuration memory cells 520 and 550 are substantially identical to configuration memory cell 500. However, replacement configuration memory cells 520 and 550 do not include multiplexers or adjacent cell access lines. The reason for this difference will become apparent in view of the subsequent disclosure. Although a 2×3 array of configuration memory cells is illustrated, arrays having other sizes are contemplated and considered within the scope of the invention. Such arrays are typically larger than a 2×3 array. A 2×3 array is used mainly to simplify the following description.

The 2×3 array includes two rows and three columns of configuration memory cells. The first row includes configuration memory cells 500, 510 and 520. Configuration memory cells 500, 510, and 520 include access transistors 501–502, 511–512 and 521–522, respectively, which are commonly connected to address line 570. Configuration memory cells 510 and 520 further include inverters 513–514 and 523–524, and output signal lines 516 and 526, respectively, as illustrated. Configuration memory cell 510 additionally includes multiplexer 515, as illustrated.

The second row includes configuration memory cells 530, 540, and 550. Configuration memory cells 530, 540, and 550 include access transistors 531–532, 541–542 and 551–552, respectively, which are commonly connected to address line 571. Configuration memory cells 530, 540 and 550 further include inverters 533–534, 543–544 and 553–554 and output terminals 536, 546, and 556, respectively, as illustrated. Configuration memory cells 530 and 540 additionally include multiplexers 535 and 545, respectively, as illustrated.

The first column of the 2×3 array includes configuration memory cells 500 and 530. Access transistors 501 and 531 are commonly connected to bit line 507 to receive configuration data value $\overline{B}$[0]. Similarly, access transistors 502 and 532 are commonly connected to bit line 508 to receive configuration data value B[0]. The control terminals of multiplexers 505 and 535 are commonly connected to bit lines 507 and 508 as illustrated. The second input terminals of multiplexers 505 and 535 are coupled to receive the configuration data values stored in adjacent memory cells 510 and 540, respectively.

The second column of the 2×3 array includes configuration memory cells 510 and 540. Access transistors 511 and 541 are commonly connected to bit line 517 to receive configuration data value $\overline{B}$[1]. Similarly, access transistors 512 and 542 are commonly connected to bit line 518 to receive configuration data value B[1]. The control terminals of multiplexers 515 and 545 are commonly connected to bit lines 517 and 518 as illustrated. The second input terminals of multiplexers 515 and 545 are coupled to receive the configuration data values stored in configuration memory cells 520 and 550, respectively.

The third column of the 2×3 array is designated as a replacement column. This replacement column includes replacement configuration memory cells 520 and 550. As described in more detail below, replacement configuration memory cells 520 and 550 are used to help replace a defective column of configuration memory cells. A defective column is defined as a column which includes one or more defective configuration memory cells. Access transistors 521 and 551 are commonly connected to bit line 527 to receive configuration data value $\overline{B}$[R]. Similarly, access transistors 522 and 552 are commonly connected to bit line 528 to receive configuration data value B[R].

The replacement of a defective column will now be described in connection with a specific example. In this example, a test of the 2×3 array reveals that configuration memory cell 500 is defective. In this example, it is desired to program configuration memory cells 500 and 540 such that these configuration memory cells provide logic high configuration data values on output lines 506 and 546, respectively. Moreover, it is desired to program configuration memory cells 510 and 530 such that these configuration memory cells provide logic low configuration data values on output lines 516 and 536, respectively.

Because configuration memory cell 500 is defective, the column which contains configuration memory cell 500 (i.e., the first column) is a defective column. As described in more detail below, this defective column is effectively replaced by shifting each column located to the right of the defective column to the left by one column.

To implement this column shifting, the configuration data values which were intended to be stored in configuration memory cells 500 and 530 of the defective first column are instead stored in configuration memory cells 510 and 540, respectively, of the second column. In addition, the logic values which were intended to be stored in configuration memory cells 510 and 540 of the second column are instead stored in configuration memory cells 520 and 550, respectively, of the replacement column.

To accomplish this, a logic high address signal A[0] is asserted on address line 570 while a logic high configuration data value B[1] is asserted on bit line 518, a logic low configuration data value $\overline{B}$[1] is asserted on bit line 517, a logic high configuration data value B[R] is asserted on bit line 527, and a logic low configuration data value B[R] is asserted on bit line 528. As a result, configuration memory cell 510 is programmed to provide a logic high configuration data value, and configuration memory cell 520 is programmed to provide a logic low configuration data value.

Subsequently, a logic high address signal A[1] is asserted on address line 571 while a logic low configuration data value B[1] is asserted on bit line 518, a logic high configuration data value $\overline{B}$[1] is asserted on bit line 517, a logic low configuration data value $\overline{B}$[R] is asserted on bit line 527, and a logic high configuration data value B[R] is asserted on bit line 528. As a result, configuration memory cell 540 is programmed to provide a logic low configuration data value, and configuration memory cell 550 is programmed to provide a logic high configuration data value.

After configuration memory cells 510, 540, 520 and 550 have been programmed, a logic high signal B[0] is asserted on bit line 508, and a low signal $\overline{B}$[0] is asserted on bit line 507. As a result, the logic high configuration data value stored in configuration memory cell 510 is routed through multiplexer 505 of configuration memory cell 500 to output line 506. In addition, the logic low configuration data value stored in configuration memory cell 540 is routed through multiplexer 535 of configuration memory cell 530 to output line 536. In this manner, the configuration data values stored in the second column are effectively shifted to the output signal lines of the first column.

Similarly, a logic high signal B[1] is asserted on bit line 518, and a low signal $\overline{B}$[1] is asserted on bit line 517. As a result, the logic low configuration data value stored in configuration memory cell 550 is routed through multiplexer 515 of configuration memory cell 510 to output line 516. In addition, the logic high configuration data value stored in configuration memory cell 550 is routed through multiplexer 545 of configuration memory cell 540 to output line 546. In this manner, the configuration data values stored in the replacement column are effectively shifted to the output lines of the second column.

In the foregoing manner, bit lines 507–508, 517–518 and 527–528 advantageously serve dual purposes. First, these bit lines are used during programming of the configuration memory cells 500, 510, 520, 530, 540, and 550. Second, after these configuration memory cells have been programmed, these bit lines facilitate the routing which enables a defective column to be replaced. Using the bit lines to serve these dual purposes advantageously reduces the required amount of routing resources between the configuration memory cells 500, 510, 520, 530, 540, and 550.

Note that replacement configuration memory cells 520 and 550 could be used to replace configuration memory cells 510 and 540 in the case where one or both of these configuration memory cells 510, 540 were defective. In this case, the configuration memory cells 500 and 530 of the first column would be directly programmed with the desired configuration data values. A low signal B[0] would be asserted on bit line 508, and a high signal $\overline{B}$[0] would be asserted on bit line 507. As a result, the configuration data value stored in configuration memory cell 500 would be routed through multiplexer 505 to output line 506. Similarly, the configuration data value stored in configuration memory cell 530 would be routed through multiplexer 535 to output line 536.

The configuration data values desired to be provided by configuration memory cells 510 and 540 would be programmed in configuration memory cells 520 and 550, respectively, as previously described. The configuration data values stored in configuration memory cells 520 and 550 would then be routed through multiplexers 515 and 545 of configuration memory cells 510 and 540, respectively, in the manner previously described.

Figure 8:
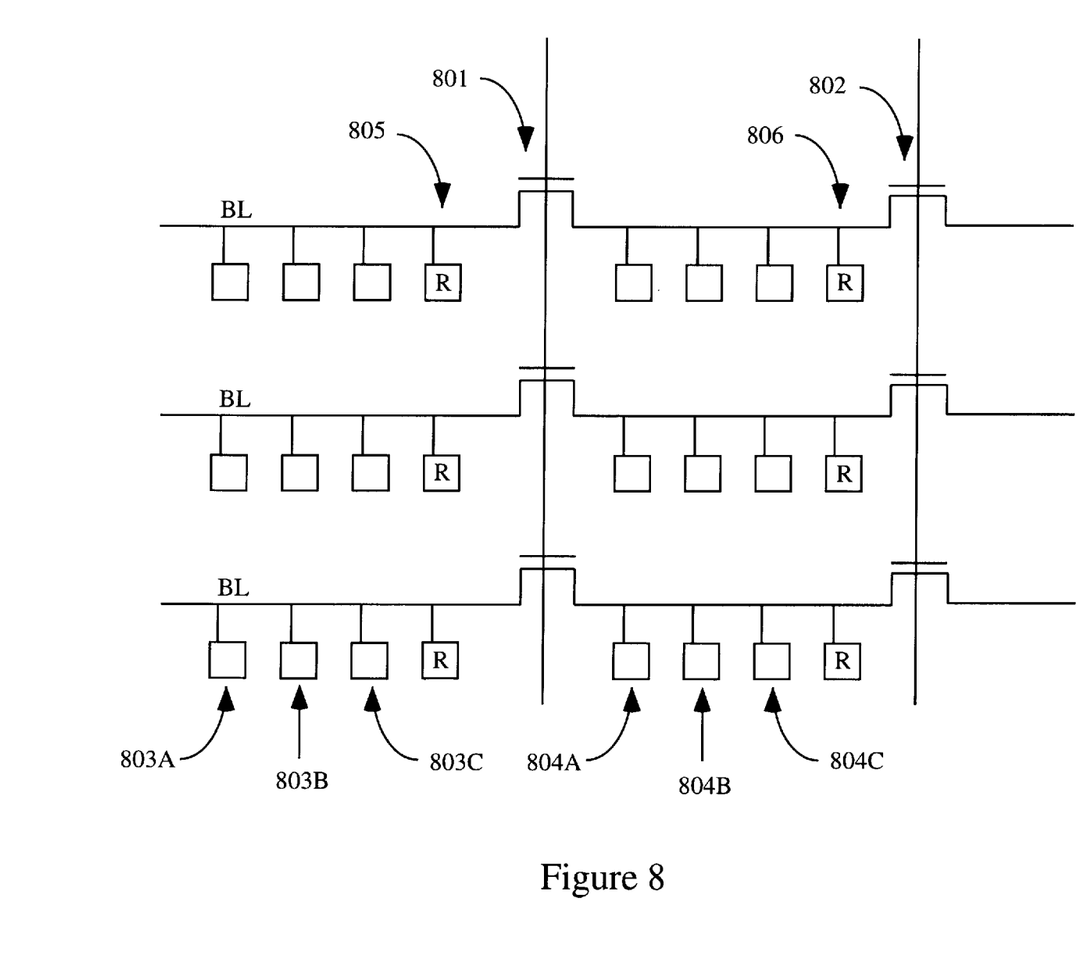
FIG. 8 is a schematic diagram of a device that includes multiple replacement columns and means to selectively disconnect shared bit lines.

In another embodiment of the present invention, a device may include multiple replacement columns and means to selectively disconnect shared bit lines so that multiple defective columns can be repaired. Specifically referring to FIG. 8, configuration memory cell column 805 provides replacement cells for one of configuration memory cell columns 803A–803C, whereas configuration memory cell column 806 provides replacement cells for one of configuration memory cell columns 804A–804C. Note that for simplicity, the address lines and the enable/disable control lines connected to the configuration memory cells are not shown (exemplary address lines and enable/disable control lines and their connection to the configuration memory cells are shown in FIGS. 4 and 7). The bit lines BL are shown. In this embodiment, if the transistors in disconnect means 801 are non-conducting, then each bit line BL is divided into two bit lines and each row of configuration memory cells is divided into multiple groups of configuration memory cells. In this manner, a plurality of defective configuration memory cell columns can be repaired simultaneously. For example, configuration memory cell columns 803B and 804A can be repaired at the same time if disconnect means 801 is non-conducting. Additional columns can be repaired simultaneously by ensuring that other disconnect means, such as disconnect means 802, are also non-conducting. Disconnect means 801 may be controlled separately from disconnect means 802, or may be controlled by the same disconnect signal.

Although the invention has been described in connection with several embodiments, it is understood that this invention is not limited to the embodiments disclosed, but is capable of various modifications which would be apparent to one of ordinary skill in the art. For example, although the present invention has been described as being implemented within a field programmable logic device (FPGA), the present invention is applicable other devices which utilize memory cells. In addition, it is understood that the conductivity types of the various transistors can be changed in other embodiments of the invention. Thus, the invention is limited only by the following claims.

I claim:

1. A memory cell comprising:
   a data storage circuit for storing a data value, the data storage circuit comprising a pair of cross-coupled inverters;
   an access transistor having a source coupled to the data storage circuit;

a bit line coupled to a drain of the access transistor;

a first control line coupled to a gate of the access transistor;

a control transistor coupled to the data storage circuit and the source of the access transistor; and a second control line coupled to a gate of the control transistor, wherein the first and second control lines are independently controllable.

2. The memory cell of claim 1, further comprising a pass transistor coupled to an output terminal of the memory cell.

3. The memory cell of claim 1, wherein the second control line is further coupled to receive a control signal which is controlled to turn on the control transistor, thereby enabling the data storage circuit when the memory cell is determined to be functional, and which is controlled to turn off the control transistor, thereby disabling the data storage circuit when the memory cell is determined to be defective.

4. The memory cell of claim 1, wherein the first control line is located in parallel with the second control line.

5. A memory cell having an output terminal, the memory cell comprising:

a data storage circuit for storing a data value, the data storage circuit comprising a first inverter and a second inverter, the first inverter having an input terminal coupled to the output terminal of the memory cell and an output terminal coupled to an input terminal of the second inverter;

an access transistor having a source coupled to the output terminal of the memory cell;

a bit line coupled to a drain of the access transistor;

a first control line coupled to a gate of the access transistor;

a control transistor having a source coupled to an output terminal of the second inverter and a drain coupled to the output terminal of the memory cell; and a second control line coupled to a gate of the control transistor.

6. A memory cell comprising:

a data storage circuit;

a control transistor coupled to the data storage circuit, wherein the control transistor is configured to selectively enable or disable the data storage circuit;

an access transistor coupled to the data storage circuit, the access transistor being configured to route a data value to the data storage circuit, wherein the data storage circuit is configured to store the data value if the data storage circuit is enabled, and wherein the data storage circuit is configured to pass the data value without storing the data value if the data storage circuit is disabled.

7. The memory cell of claim 6, further comprising:

a bit line coupled to the access transistor, wherein the bit line is configured to receive the data value;

a first control line coupled to a gate of the access transistor; and a second control line coupled to a gate of the control transistor.

8. The memory cell of claim 7, wherein the first and second control lines extend in parallel through the memory cell, and wherein the bit line extends perpendicular to the first and second control lines.

9. The memory cell of claim 6, wherein the memory storage circuit comprises a first inverter and a second inverter coupled in a cross-coupled configuration, the control transistor being coupled in series with the first inverter and the second inverter.

10. The memory cell of claim 9, wherein the first inverter has an input terminal connected to the access transistor, and an output terminal connected to an input terminal of the second inverter, wherein an output terminal of the second inverter is coupled to the control transistor, and wherein the control transistor is connected to the input terminal of the first inverter.

* * * * *